(12) United States Patent
Moyama et al.

(10) Patent No.: US 9,111,726 B2
(45) Date of Patent: Aug. 18, 2015

(54) PLASMA PROCESSING APPARATUS (75) Inventors: Kazuki Moyama, Miyagi (JP);
Kiyotaka Ishibashi, Miyagi (JP);
Osamu Morita, Miyagi (JP); Takehiro
Tanikawa, Miyagi (JP); Naoki
Matsumoto, Miyagi (JP); Naoki
Mihara, Miyagi (JP); Wataru
Yoshikawa, Miyagi (JP)

(73) Assignee: TOKYO ELECTRON LIMITED,
Tokyo (JP)

( * ) Notice: Subject to any disclaimer, the term of this
patent is extended or adjusted under 35
U.S.C. 154(b) by 346 days.

(21) Appl. No.: 13/454,513

(22) Filed: Apr. 24, 2012

(65) Prior Publication Data
US 2012/0267048 A1 Oct. 25, 2012

(30) Foreign Application Priority Data

Apr. 25, 2011 (JP) .................. 2011-097336
Apr. 9, 2012 (JP) .................. 2012-088583

(51) Int. Cl.
C23C 16/00 (2006.01)
C23F 1/00 (2006.01)
H01L 21/306 (2006.01)
H01J 37/32 (2006.01)

(52) U.S. Cl.
CPC ....... *H01J 37/32192* (2013.01); *H01J 37/3244*
(2013.01); *H01J 37/32229* (2013.01)

(58) Field of Classification Search
CPC ............ H01J 37/32192; H01J 37/3244; H01J
37/32229

USPC ............ 156/345.33, 345.34, 345.35, 345.36,
156/345.41; 118/723 MW, 723 ME, 723 MR,
118/715
See application file for complete search history.

(56) References Cited

U.S. PATENT DOCUMENTS

| 6,622,650 | B2 * | 9/2003 | Ishii et al. ............. 118/723 MW |
| 6,646,224 | B2 * | 11/2003 | Ishii et al. ................ 219/121.43 |
| 2003/0150846 | A1 | 8/2003 | Ishii |
| 2006/0254716 | A1 * | 11/2006 | Mosden et al. .......... 156/345.43 |
| 2009/0000742 | A1 | 1/2009 | Okesaku |
| 2009/0242130 | A1 * | 10/2009 | Tian et al. ................. 156/345.41 |
| 2010/0041238 | A1 * | 2/2010 | Cooperberg et al. ......... 438/710 |
| 2010/0101728 | A1 * | 4/2010 | Iwasaki .................... 156/345.33 |

(Continued)

FOREIGN PATENT DOCUMENTS

| CN | 1639831 A | 7/2005 |
| CN | 101176187 A | 5/2008 |
| CN | 101647101 A | 2/2010 |

(Continued)

*Primary Examiner* — Rakesh Dhingra
(74) *Attorney, Agent, or Firm* — Pearne & Gordon LLP (57) ABSTRACT A plasma processing apparatus includes a processing chamber, a stage, a dielectric member, a microwave introduction device, an injector, and an electric field shield. The processing chamber has a processing space therein. The stage is provided within the processing chamber. The dielectric member has a through hole and is provided to face the stage. The microwave introduction device is configured to introduce microwave into the processing space via the dielectric member. The injector has at least one through hole and is made of a dielectric material, e.g., a bulk dielectric material. The injector is provided within the dielectric member. The injector and the through hole of the dielectric member form a path for supplying a processing gas into the processing space. The electric field shield encloses the injector.

12 Claims, 6 Drawing Sheets

(56) References Cited

U.S. PATENT DOCUMENTS

| | | | |
|---|---|---|---|
| 2011/0049100 A1 * | 3/2011 | Han et al. ........................ | 216/67 |
| 2011/0114261 A1 * | 5/2011 | Matsumoto et al. ..... | 156/345.33 |

FOREIGN PATENT DOCUMENTS

| | | | | |
|---|---|---|---|---|
| CN | 101919041 A | 12/2010 | | |
| JP | WO 2008123605 | * 10/2008 | ............ | H01L 21/205 |
| JP | 2010-021243 A | 1/2010 | | |
| JP | WO 2010004836 | * 1/2010 | ............... | C23F 1/08 |
| KR | 10-2007-0020571 A | 2/2007 | | |
| KR | 10-2008-0108922 A | 12/2008 | | |
| KR | WO 2009091189 | * 7/2009 | ............... | C23F 1/08 |
| KR | 10-2010-0027062 A | 3/2010 | | |
| TW | 200733201 A | 9/2007 | | |
| TW | 201011829 A | 3/2010 | | |
| WO | 03/034463 A2 | 4/2003 | | |
| WO | 2008/123605 A1 | 10/2008 | | |
| WO | 2009/091189 A2 | 7/2009 | | |
| WO | 2010/004836 A1 | 1/2010 | | |

* cited by examiner

PLASMA PROCESSING APPARATUS

CROSS-REFERENCE TO RELATED APPLICATION

This application claims the benefit of Japanese Patent Application Nos. 2011-097336 and 2012-088583 filed on Apr. 25, 2011, and Apr. 9, 2012, respectively, the entire disclosures of which are incorporated herein by reference.

FIELD OF THE INVENTION

The present disclosure relates to a plasma processing apparatus.

BACKGROUND OF THE INVENTION

A plasma processing apparatus is described in Patent Document 1. The plasma processing apparatus disclosed in Patent Document 1 includes a processing chamber, a stage, a microwave generator, an antenna, a dielectric window, a coaxial waveguide, and an injector base.

The stage is accommodated in the processing chamber, and a processing target substrate is mounted on the stage. The antenna is provided above the stage. The antenna is connected with the microwave generator via the coaxial waveguide. The antenna includes a slot plate having slots. The dielectric window is provided between the antenna and a processing space above the stage.

The dielectric window has a space for accommodating therein the injector base and also has a through hole extending from that space toward the processing space. The injector base is prepared by forming an $Y_2O_3$ film on an aluminum base. The injector base has a through hole.

In this plasma processing apparatus, a processing gas is introduced into the processing space through a hole inside an inner conductor of the coaxial waveguide, the through hole of the injector base, and the through hole of the dielectric window.

Patent Document 1: Japanese Patent Laid-open Publication No. 2010-021243

The present inventors have conducted researches for further suppressing particle generation in the plasma processing apparatus as disclosed in Patent Document 1 and have found out that a small number of particles having a diameter of several tens of nanometers may be generated when a fluorine-based processing gas is used.

BRIEF SUMMARY OF THE INVENTION

In view of the foregoing problem, it has been required in the art to further reduce particle generation in order to manufacture a semiconductor device having higher performance efficiency.

In accordance with one aspect of an illustrative embodiment, there is provided a plasma processing apparatus including a processing chamber, a stage, a dielectric member, a microwave introduction device, an injector, and an electric field shield. The processing chamber has a processing space therein. The stage is provided within the processing chamber. The dielectric member has a through hole and is provided to face the stage. The microwave introduction device is configured to introduce microwave into the processing space via the dielectric member. The injector has at least one through hole and is made of a dielectric material, e.g., a bulk dielectric material. The injector is provided within the dielectric member. The injector and the through hole of the dielectric member form a path for supplying a processing gas into the processing space. The electric field shield encloses the injector.

As for a conventional injector base as mentioned above, particles may be generated as a result of a chemical reaction such as reduction or fluorination of a material, e.g., $Y_2O_3$ contained in a film on a surface of the base. Since, however, the injector of the plasma processing apparatus in accordance with the illustrative embodiment is made of the dielectric material (e.g., a bulk quartz material), the injector is chemically stable. Further, in the plasma processing apparatus, since the electric field shield is provided at a vicinity of the injector made of the dielectric material, it is possible to suppress plasma generation within the injector. Hence, in accordance with this plasma processing apparatus, it is possible to further suppress particle generation.

In accordance with the illustrative embodiment, the injector may be in contact with the dielectric member. Further, the injector may be formed as one single body with the dielectric member. By allowing the injector to be contact with the dielectric member or forming the injector as one single body with the dielectric member, it is possible to prevent a gap between the injector and the dielectric member. Accordingly, it is possible to prevent contamination of components within the plasma processing apparatus due to leakage of the processing gas from the gap between the injector and the dielectric member.

In accordance with the illustrative embodiment, the injector may have a first surface and a second surface opposite to the first surface, and the second surface may face the processing space. The at least one through hole of the injector may be extended between the first surface and the second surface. The electric field shield may be extended to a position closer to the processing space than the second surface in a direction from the first surface toward the second surface. In accordance with this illustrative embodiment, it is possible to further reduce electric field intensity in the injector. As a result, it is possible to suppress plasma generation within the injector.

In accordance with the illustrative embodiment, the microwave introduction device may include a coaxial waveguide and an antenna coupled to the coaxial waveguide. The antenna may include a slot plate that is made of a metal and has a multiple number of slots in a radial direction and in a circumferential direction thereof. The processing gas may be supplied from a pipe disposed in a hole inside an inner conductor of the coaxial waveguide. With this configuration, the electric field shield may be integrated as one single body with the pipe.

In accordance with the illustrative embodiment, each of the at least one through hole of the injector may have a slit shape. By forming the through hole in the slit shape, the through hole may have a narrow width. Accordingly, inside of the injector, i.e., in the through hole of the injector, plasma generation can be further suppressed. Further, the slit-shaped through hole may include a through hole formed in a zigzag shape along a surface parallel to a direction in which the through hole is formed.

In accordance with the illustrative embodiment, each of the at least one through hole of the injector may be formed such that the width thereof is decreased toward the processing space. Further, the at least one through hole of the injector may be formed by laser machining.

In accordance with the illustrative embodiment, a narrowest portion of the at least one through hole of the injector may have a width equal to or smaller than about 0.2 mm. Here, the narrowest portion implies a region of the through hole, having the narrowest width in a direction in which the through hole is formed. In accordance with the illustrative embodiment, as the width of the narrowest portion of the slit-shaped through hole becomes smaller than a Debye length, plasma generation within the injector can be suppressed more efficiently.

As described above, in accordance with the illustrative embodiments, there is provided a plasma processing apparatus capable of reducing particle generation.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described with reference to the accompanying drawings. Through the drawings, like reference numerals are assigned to like or corresponding parts.

Figure 1:
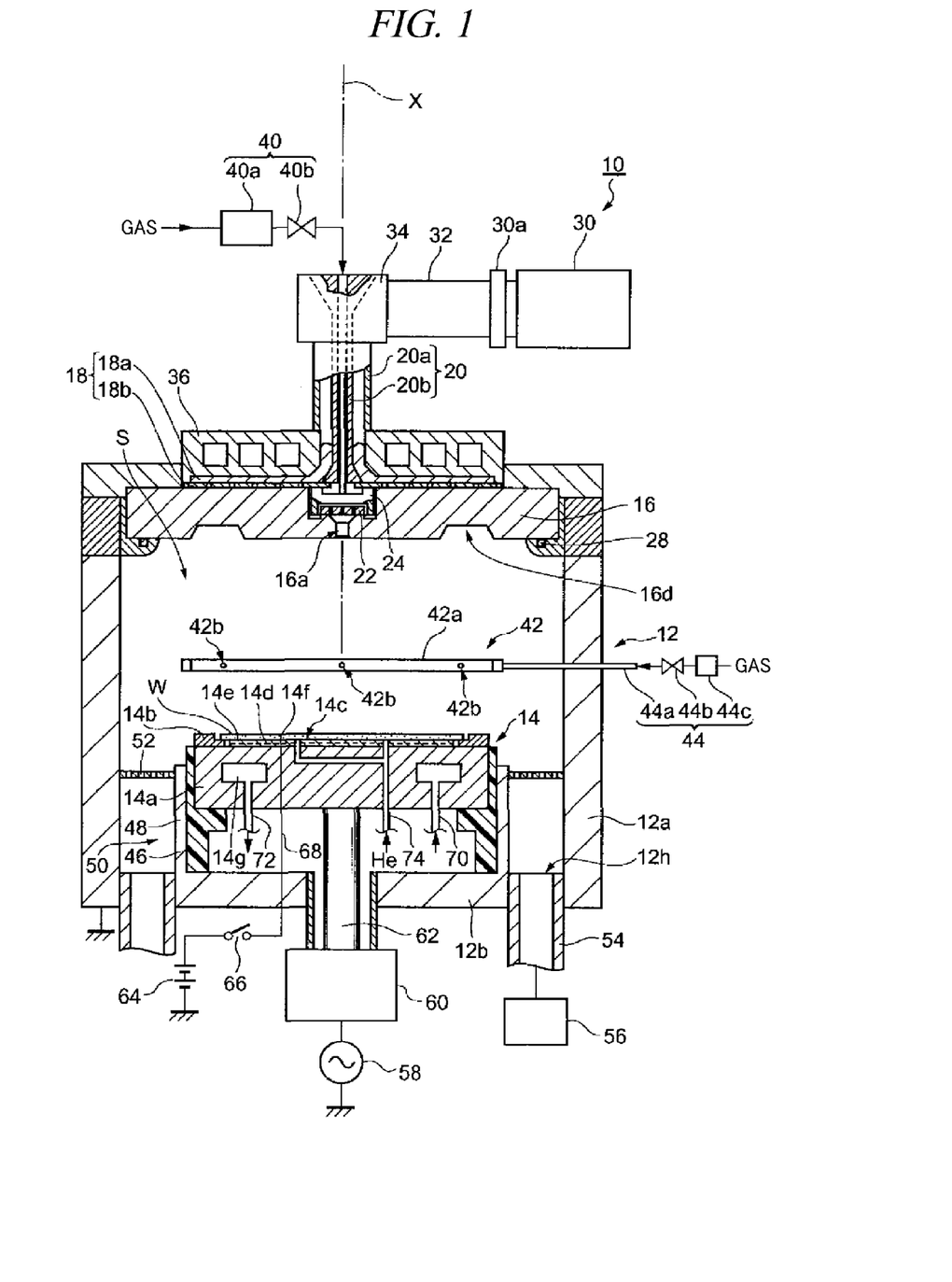
FIG. 1 is a cross sectional view schematically illustrating a plasma processing apparatus in accordance with an illustrative embodiment.

FIG. 1 is a cross sectional view schematically illustrating a plasma processing apparatus in accordance with an illustrative embodiment. The plasma processing apparatus 10 depicted in FIG. 1 includes a processing chamber 12, a stage 14, a dielectric member 16, an antenna 18, a coaxial waveguide 20, an injector 22, and a pipe member 24.

The processing chamber 12 has therein a processing space S in which a plasma process is performed on a processing target substrate W. The processing chamber 12 may have a sidewall 12a and a bottom 12b. The sidewall 12a has a substantially cylindrical shape extending in a direction of an axis line X. The bottom 12b is positioned at a lower end of the sidewall 12a. An exhaust hole 12h for gas exhaust is formed at the bottom 12b. An upper end portion of the sidewall 12a is opened.

The opening at the upper end portion of the sidewall 12a is closed by the dielectric member 16 called a dielectric window. An O-ring 28 may be provided between the dielectric member 16 and the upper end portion of the sidewall 12a. By the O-ring 28, the processing chamber 12 can be sealed more efficiently.

The plasma processing apparatus 10 may further include a microwave generator 30. The microwave generator 30 is configured to generate microwave of, e.g., about 2.45 GHz. The microwave generator 30 has a tuner 30a. The microwave generator 30 is connected to an upper portion of the coaxial waveguide 20 via a waveguide 32 and a mode converter 34.

The coaxial waveguide 20 extends along the axis line X. The coaxial waveguide 20 includes an outer conductor 20a and an inner conductor 20b. The outer conductor 20a has a cylindrical shape extending in the direction of the axis line X. A lower end of the outer conductor 20a may be electrically connected with an upper portion of a cooling jacket 36. The inner conductor 20b is provided inside the outer conductor 20a. The inner conductor 20b extends along the axis line X. A lower end of the inner conductor 20b is connected to a slot plate 18b of the antenna 18.

The antenna 18 includes a dielectric plate 18a and the slot plate 18b. The dielectric plate 18a has a substantially circular plate shape and is made of, e.g., quartz or alumina. The dielectric plate 18a is held between the slot plate 18b and a bottom surface of the cooling jacket 36. That is, the antenna 18 is formed by the dielectric plate 18a, the slot plate 18b, and the bottom surface of the cooling jacket 36.

The slot plate 18b is a substantially circular metal plate having a multiple number of slots. In accordance with the illustrative embodiment, the antenna 18 may be a radial line slot antenna. That is, in accordance with the illustrative embodiment, a multiple number of slot pairs are formed at the slot plate 18b. Each slot pair includes two slots elongated in directions intersecting each other or orthogonal to each other. The multiple number of slot pairs are arranged about the axis line X at a regular interval in a radial direction. The slot pairs may also be arranged at a regular interval in a circumferential direction. Microwave generated by the microwave generator 30 is propagated to the dielectric plate 18a through the coaxial waveguide 20, and then, is introduced into the dielectric member 16 through the slots of the slot plate 18b.

The dielectric member 16 has a substantially circular plate shape and is made of, e.g., quartz or alumina. The dielectric member 16 is positioned directly under the slot plate 18b to face the stage 14 in the direction of the axis line X. The dielectric member 16 transmits the microwave received from the antenna 18 and introduces the microwave into the processing space S. As a result, an electric field is generated directly under the dielectric member 16, and plasma is generated in the processing space S. In this way, in accordance with the plasma processing apparatus 10, it is possible to generate the plasma by using the microwave without applying a magnetic field.

In accordance with the illustrative embodiment, a recess 16d may be formed on a bottom surface of the dielectric member 16. The recess 16d is annularly formed about the axis line X and has a tapered shape. The recess 16d is formed to facilitate generation of a standing wave by the introduced microwave, and, thus, the recess 16d may contribute to efficient plasma generation by the microwave.

In the plasma processing apparatus 10, the inner conductor 20b may have a cylinder shape extending along the axis line X. The pipe member 24 may be inserted in the inner conductor 20b. One end of the pipe member 24 is connected with a gas supply system 40. The gas supply system 40 may include a flow rate controller 40a such as a mass flow controller and an opening/closing valve 40b. In accordance with the illustrative embodiment, a processing gas from the gas supply system 40 is supplied into the injector 22 through the pipe member 24. The processing gas from the pipe member 24 is then supplied into the processing space S through the injector 22 and a through hole 16a of the dielectric member 16.

In accordance with the illustrative embodiment, the plasma processing apparatus 10 may include another gas supply device 42. The gas supply device 42 includes a gas line 42a. The gas line 42a is annularly extended about the axis line X between the dielectric member 16 and the stage 14. The gas line 42a has a multiple number of gas holes 42b through which a gas is discharged in a direction toward the axis line X. The gas supply device 42 is connected with a gas supply system 44.

The gas supply system 44 includes a gas line 44a, an opening/closing valve 44b, and a flow rate controller 44c such as a mass flow controller. A processing gas is supplied into the gas line 42a of the gas supply device 42 via the flow rate controller 44c, the opening/closing valve 44b, and the gas line 44a. The gas line 44a is inserted through the sidewall 12a of the processing chamber 12. The gas line 42a of the gas supply device 42 may be supported at the sidewall 12a via the gas line 44a.

The stage 14 is positioned such that the processing space S is provided between the antenna 18 and the stage 14. The processing target substrate W is mounted on the stage 14. In accordance with the illustrative embodiment, the stage 14 includes a table 14a, a focus ring 14b, and an electrostatic chuck 14c.

The table 14a is supported on a cylindrical support 46. The cylindrical support 46 is made of an insulating material and is uprightly extended from the bottom 12b. Further, a conductive cylindrical support 48 is provided on an outer periphery of the cylindrical support 46. The cylindrical support 48 uprightly extends from the bottom 12b of the processing chamber 12 along the outer periphery of the cylindrical support 46. An annular exhaust path 50 is formed between the cylindrical support 46 and the sidewall 12a.

An annular baffle plate 52 having a multiple number of through holes is provided at an upper portion of the exhaust path 50. An exhaust device 56 is connected to a lower portion of the exhaust hole 12h via an exhaust line 54. The exhaust device 56 has a vacuum pump such as a turbo molecular pump. The exhaust device 56 is configured to depressurize the processing space S within the processing chamber 12 to a required vacuum level.

The table 14a serves as a high frequency electrode. The table 14a is electrically connected with a high frequency power supply 58 for RF bias via a matching unit 60 and a power supply rod 62. The high frequency power supply 58 outputs a high frequency power of a certain frequency, e.g., about 13.65 MHz, for controlling the energy of ions attracted into the processing target substrate W at a certain power level. The matching unit 60 includes a matching device for matching impedance on the side of the high frequency power supply 58 and impedance on a load side such as the electrode, the plasma, and the processing chamber 12. The matching device may include a blocking capacitor for generating a self bias.

The electrostatic chuck 14c is provided on a top surface of the table 14a. The electrostatic chuck 14c holds thereon the processing target substrate W by an electrostatic attractive force. The focus ring 14b is annularly provided at an outside of the electrostatic chuck 14c in a radial direction to surround the processing target substrate W. The electrostatic chuck 14c includes an electrode 14d, and insulating films 14e and 14f. The electrode 14d is formed with a conductive film and is embedded between the insulating film 14e and the insulating film 14f. The electrode 14d is electrically connected with a high-voltage DC power supply 64 via a switch 66 and a coating line 68. The electrostatic chuck 14c is capable of attracting and holding the processing target substrate W by a Coulomb force generated by a DC voltage applied from the DC power supply 64.

A coolant path 14g annularly extending in a circumferential direction of the table 14a is provided within the table 14a. A coolant of a certain temperature, e.g., cooling water from a chiller unit (not shown) is supplied into and circulated through the coolant path 14g through pipes 70 and 72. Depending on a temperature of the coolant, a heat transfer gas for the electrostatic chuck 14c, e.g., a He gas is supplied between a top surface of the electrostatic chuck 14c and a rear surface of the processing target substrate W through a gas supply line 74.

Figure 2:
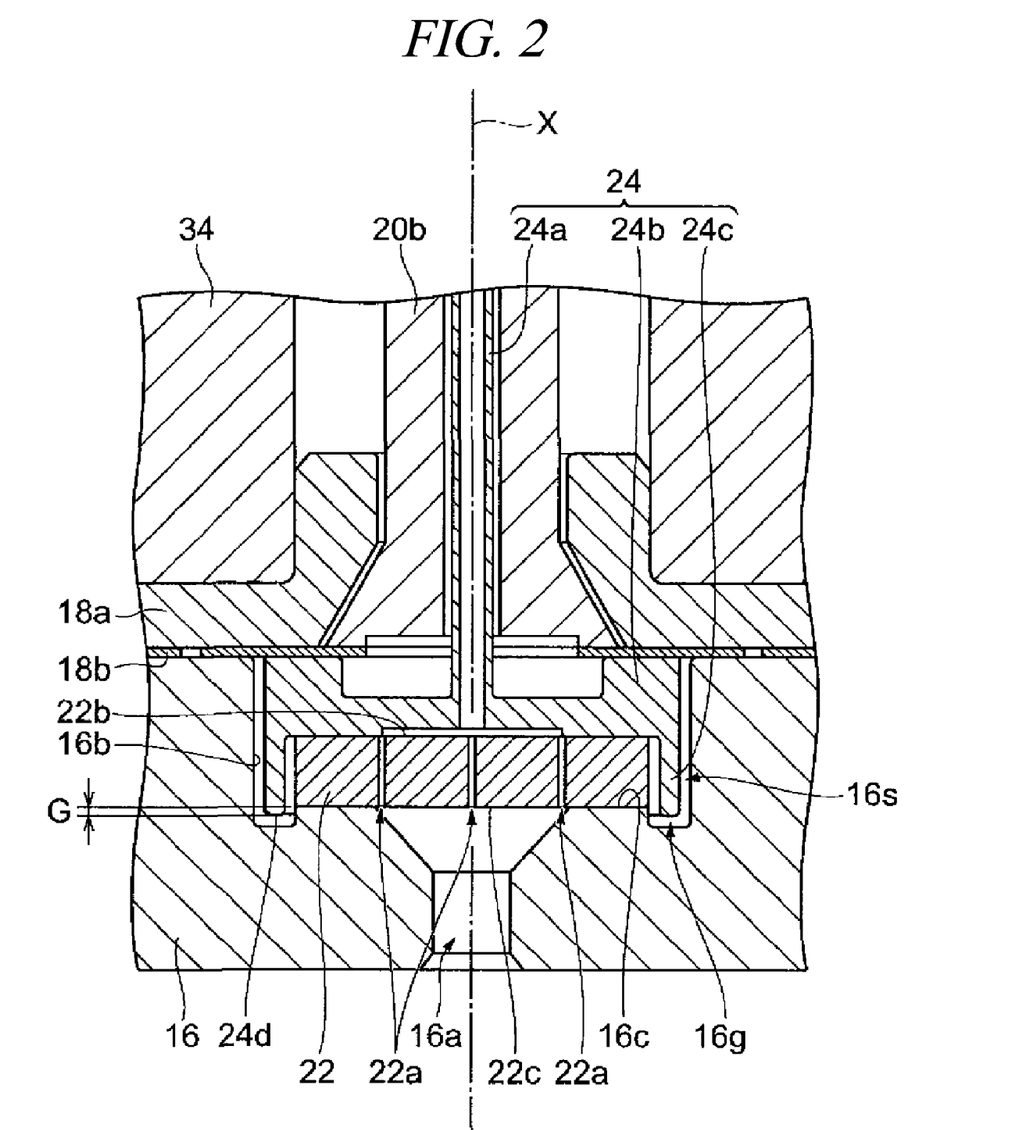
FIG. 2 is an enlarged cross sectional view illustrating an injector shown in FIG. 1 and the vicinity thereof.

Now, the injector 22 and the vicinity thereof will be discussed in further detail with reference to FIG. 2. FIG. 2 is an enlarged cross sectional view illustrating the injector shown in FIG. 1 and the vicinity thereof.

As illustrated in FIG. 2, the through hole 16a extending along the axis line X is formed in the dielectric member 16 having the substantially circular plate shape. The through hole 16a may have a tapered shape tapering to a lower portion. In the dielectric member 16, a space 16s is formed above the through hole 16a. The space 16s is formed by, e.g., a bottom surface 16c and an inner peripheral surface 16b of the dielectric member 16 extended along the axis line X. Further, the dielectric member 16 also has an annular groove 16g formed to be connected with a lower periphery portion of the space 16s.

The pipe member 24 may be a metallic member and may be made of, e.g., stainless steel. The pipe member 24 includes a first part 24a, a second part 24b, and a third part 24c. The first part 24a is a pipe extending along the axis line X and is inserted in the hole inside the inner conductor 20b.

The second part 24b is connected with a lower portion of the first part 24a. The second part 24b has a larger diameter than that of the first part 24a. The second part 24b has a hole connected with the hole inside the first part 24a. The slot plate 18b is held between the second part 24b and a lower end of the inner conductor 20b.

The third part 24c is extended downwardly while connected with a lower periphery portion of the second part 24b. The third part 24c has an annular shape. A lower end of the third part 24c is accommodated in the above-described groove 16g.

As depicted in FIG. 2, the injector 22 is made of a dielectric material and has a substantially circular plate shape. The injector 22 may be made of a bulk dielectric material. By way of example, the dielectric material forming the injector 22 may be, but not limited to, quartz or $Y_2O_3$.

The injector 22 has two surfaces 22b and 22c extended in an orthogonal direction to the axis line X. The surface 22c is positioned opposite to the surface 22b and faces the processing space S. The injector 22 also has one or more through holes 22a extending between the surface 22c and the surface 22b. For example, the injector 22 having this configuration may be manufactured by performing a machining process on a bulk dielectric material and, then, removing a fragmental layer on a surface of the bulk dialectic material by wet etching or the like. By removing the fragmental layer, the injector 22 can be more stabilized chemically.

The injector 22 is disposed in the space 16s within the dielectric member 16. To elaborate, the injector 22 is mounted on the bottom surface 16c that partitions and forms the space 16s. With this arrangement, the injector 22 is positioned in a partial space formed by the bottom surface 16c, a lower surface of the second part 24b of the pipe member 24, and the third part 24c of the pipe member 24.

The processing gas from the pipe member 24 passes through the through holes 22a of the injector 22 and is supplied into the processing space S through the through hole 16a of the dielectric member 16. That is, the injector and the hole 16a of the dielectric member 16 form together a path for supplying the processing gas into the processing space S. In this configuration, the processing gas passes through the inside of the injector 22. Since the injector 22 is made of the dielectric material, the injector is chemically stabilized against the processing gas. Accordingly, it is possible to reduce particle generation from the injector 22.

In the plasma processing apparatus 10, the third part 24c of the pipe member 24 forms an electric field shield that encloses the vicinity of the injector 22. Due to the electric field shield, plasma generation within the injector 22 becomes more difficult. Accordingly, it is possible to further suppress particle generation from the injector 22.

Further, in accordance with the illustrative embodiment, the injector 22 may be in contact with the bottom surface 16c of the dielectric member 16 by, e.g., diffusion joint. With this configuration, a gap between the injector 22 and the dielectric member 16 can be avoided. Accordingly, it is possible to prevent components of the plasma processing apparatus 10 from being contaminated as a result of a backflow of the processing gas from the processing space S into the space 16s through the gap.

Furthermore, in accordance with the illustrative embodiment, the third part 24c serving as the electric field shield for the injector 22 may be formed as a part of the pipe member 24. That is, the electric field shield may be formed as a single body with the pipe for supplying a processing gas into the injector 22. With this configuration, a manufacturing process such as assembly and arrangement of the electric field shield can be simplified.

In addition, in accordance with the illustrative embodiment, the third part 24c, i.e., the electric field shield may be extended up to a position closer to the processing space S than the surface 22c of the injector 22 in the direction of the axis line X. With this configuration, electric field intensity in the space where the injector 22 is disposed can be further reduced. As a result, it is possible to further reduce particle generation from the injector 22.

Here, simulation results for a relationship between electric field intensity in the space where the injector 22 is disposed and a distance G, in the direction of the axis line X, between a lower end surface of the electric field shield, i.e., a lower end surface 24d of the third part 24c and the surface 22c of the injector 22 will be described.

In this simulation, the distance G is set to, e.g., about 3.0 mm, about 2.2 mm, about −2.8 mm, and about −7.3 mm. Here, a negative distance G indicates that the lower end surface 24d of the electric field shield is positioned above the surface 22c of the injector 22. According to this simulation results, when the distance G is about 3.0 mm, the electric field intensity is about 3600 V/m; when the distance G is about 2.2 mm, the electric field intensity is about 5397 V/m; when the distance G is about −2.8 mm, the electric field intensity is about 9010 V/m; and when the distance G is about −7.3 mm, the electric field intensity is about 11422 V/m. From these results, it is proved that by locating the lower end surface 24d of the electric field shield at a lower position than the surface 22c of the injector 22, the electric field intensity can be reduced and plasma generation within the injector 22 can be suppressed effectively.

Figure 3:
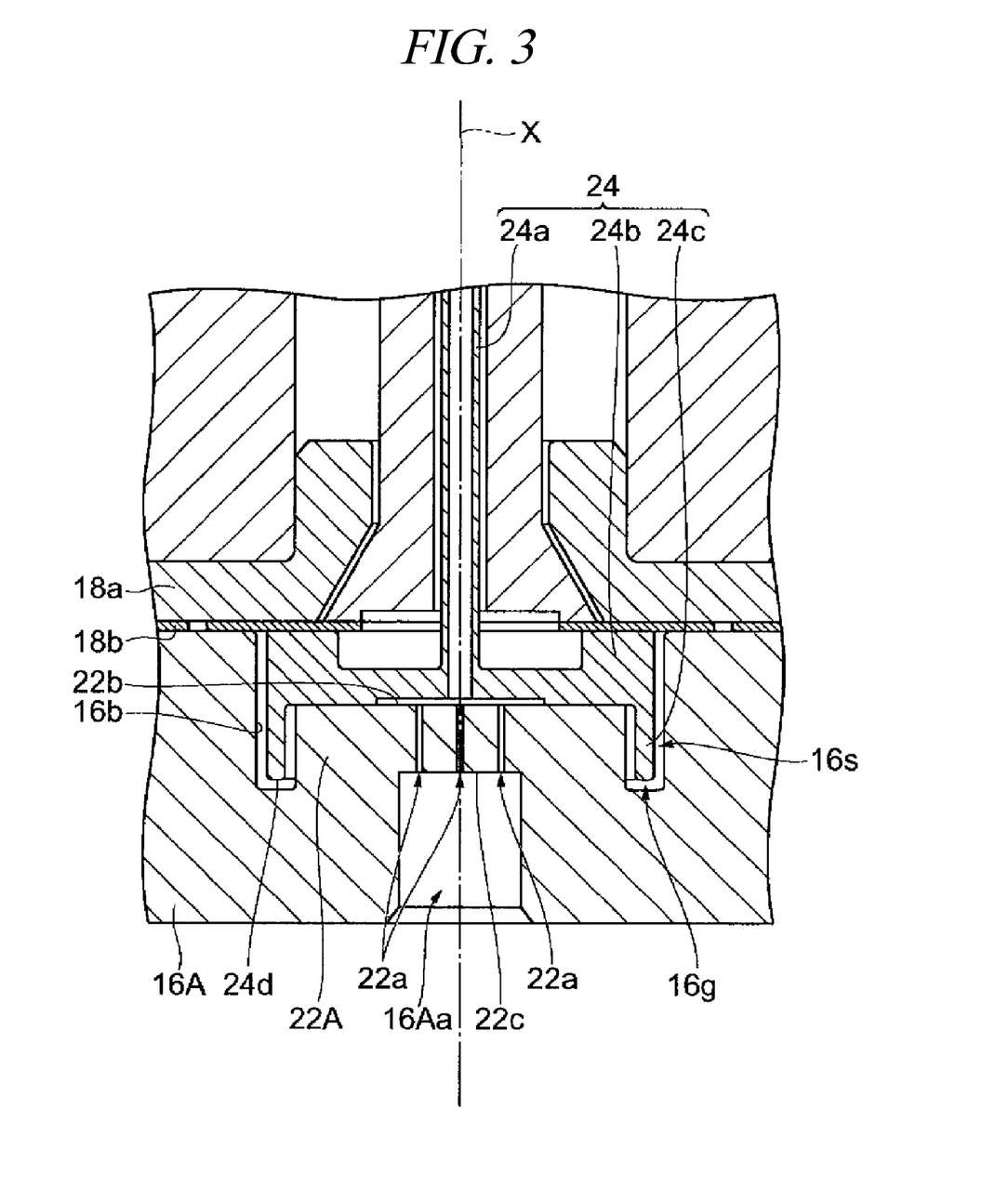
FIG. 3 is an enlarged cross sectional view illustrating an injector in accordance with another illustrative embodiment and the vicinity thereof.

Now, various injectors will be explained. FIG. 3 is an enlarged cross sectional view illustrating an injector in accordance with another illustrative embodiment and the vicinity thereof. In the configuration shown in FIG. 3, a dielectric member 16A is used instead of the dielectric member 16, and an injector 22A is used instead of the injector 22. Below, the configuration of FIG. 3 will be described while focused on distinctive parts from those of FIG. 2.

The dielectric member 16A has a through hole 16Aa. Unlike the thorough hole 16a, the through hole 16Aa has a substantially regular diameter along a direction of an axis line X. The dielectric member 16A and the injector 22A are formed as one single body. In accordance with this configuration, it is possible to prevent a gap between the injector 22A and the dielectric member 16A more securely.

Figure 4:
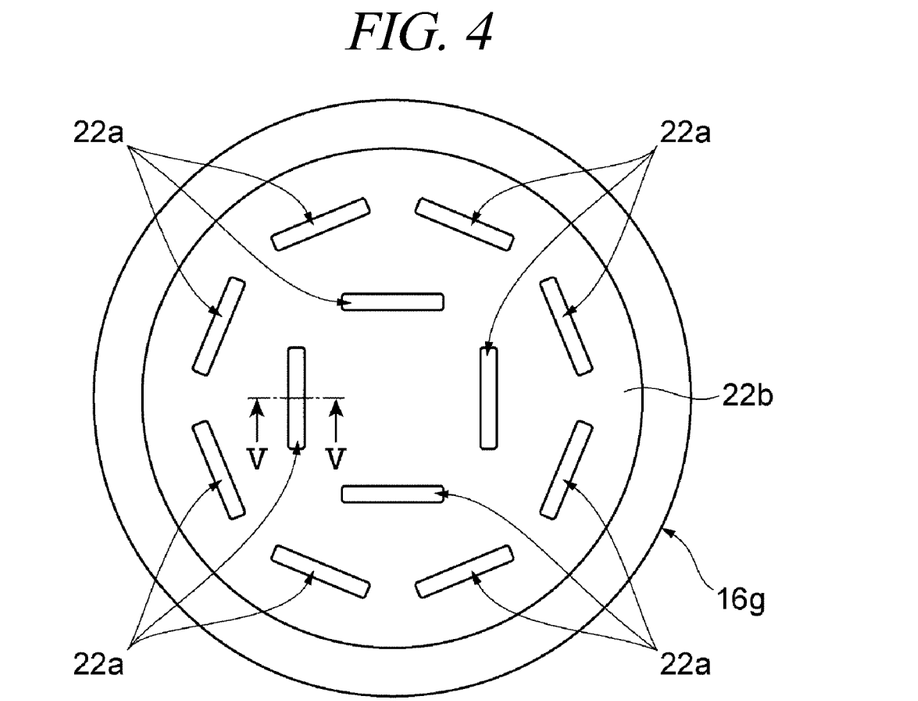
FIG. 4 is a plane view illustrating an injector in accordance with still another illustrative embodiment.
Figure 5:
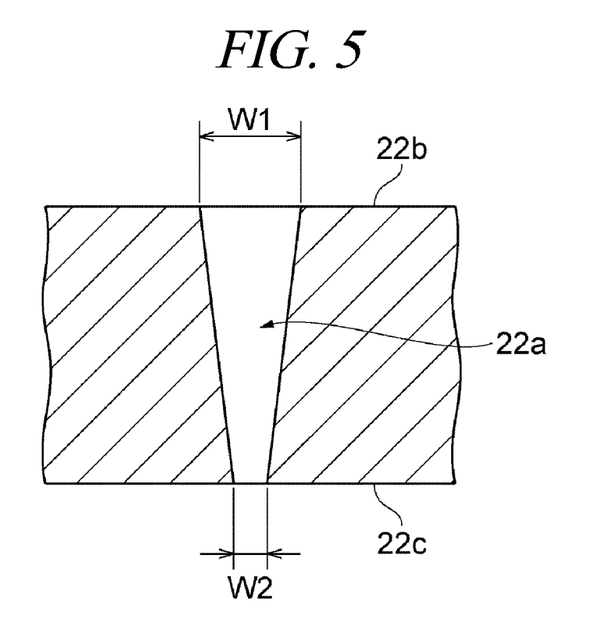
FIG. 5 is a cross sectional view taken along a line V-V of FIG. 4.

Hereinafter, FIGS. 4 and 5 will be referred. FIG. 4 is a plane view illustrating an injector in accordance with still another illustrative embodiment, when viewed from the top. FIG. 5 is a cross sectional view taken along a line V-V of FIG. 4. Each of the through holes of the injector of the plasma processing apparatuses shown in FIGS. 1 to 3 may have, e.g., a circular shape when viewed on a plane orthogonal to a direction in which the through hole is formed. However, the shape of the through hole of the injector may not be limited thereto. By way of example, as illustrated in FIGS. 4 and 5, there may be provided slit-shaped through holes 22a. To elaborate, a cross section of the slit-shaped through holes 22a may have substantially rectangular or oval shapes. By forming the through holes 22a to have slit shapes in this way, the through holes 22a have narrow widths. Accordingly, by using these slit-shaped through holes 22a, plasma generation in the through holes 22a can be further suppressed. As the plasma generation is suppressed, deposit generation on the injector surface is also prevented, and damage of the inner wall of the injector, which partitions and forms the through holes 22a, can also be suppressed.

As depicted in FIG. 5, in accordance with the illustrative embodiment, the width of each slit-shaped through hole 22a may be decreased toward the processing space S. That is, the through hole 22a may have a tapered shape whose width is gradually decreased from a surface 22b toward a surface 22c. The through hole having such a tapered shape may be formed by, e.g., laser machining.

In accordance with the illustrative embodiment, the width of a narrowest portion of the slit-shaped through hole 22a may be set to be equal to or smaller than, e.g., about 0.2 mm. Here, the narrowest portion implies a region of the through hole 22a, having the narrowest width in the direction in which the through hole 22a is formed, i.e., in the direction of the axis line X. In accordance with the present illustrative embodiment, the width of the narrowest portion of the through hole 22a is smaller than a Debye length ($\lambda_D$). The Debye length ($\lambda_D$) is defined by the following Equation (1).

[Equation 1]

$$\lambda_D(\text{cm}) = 7.43 \times 10^2 \sqrt{\frac{T_e(\text{eV})}{n_0(\text{cm}^{-3})}} \tag{1}$$

In Equation (1), $T_e$ represents an electron temperature, and $n_o$ represents an electron density. In a space having a width smaller than the Debye length defined as above, plasma is not generated. Here, when using the plasma processing apparatus 10, an electron temperature is set to be at least about 4 eV, and an electron density is set to be about $5 \times 10^{10}$ cm$^{-3}$ at most. Accordingly, the Debye length set in the plasma processing apparatus 10 is at least about 0.2 mm. Accordingly, by setting the width of the narrowest portion of the slit-shaped through hole 22a to be equal to or smaller than about 0.2 mm, plasma generation in the through hole 22a can be suppressed more effectively.

Now, an experiment result for the plasma processing apparatus 10 having the injector shown in FIGS. 4 and 5 will be explained. In this experiment, a thickness of the injector, i.e., a distance between the surface 22b and the surface 22c is set to be, e.g., about 4 mm; a width W1 of the slit-shaped through hole 22a on the side of the surface 22b is set to be, e.g., about 0.25 mm; and a width W2 of the slit-shaped through hole 22a on the side of the surface 22c is set to be, e.g., about 0.1 mm. The other conditions are as follows.

Power of microwave: about 2000 W
Frequency of microwave: about 2.45 GHz
Power of RF bias: about 120 W
Frequency of RF bias: about 13.56 MHz
Processing gas: a gaseous mixture of an Ar gas (about 1000 sccm), a $CH_2F_2$ gas (about 5 sccm), and an $O_2$ gas (about 2 sccm)
Flow rate ratio (flow rate from the injector:flow rate from the gas supply device 42): about 30:about 70
Pressure within the processing chamber: about 20 mTorr (about 2.666 Pa)

As the experiment result, plasma-based light emission in the through hole 22a is not observable, and no carbon-containing deposit is found on the surface 22b. From this result, it is proved that plasma generation within the injector and deposit generation on the surface of the injector are both suppressed. Accordingly, it is also proved that the damage of the inner wall of the injector, which partitions and forms the through hole 22a, and particle generation are suppressed.

Figure 6:
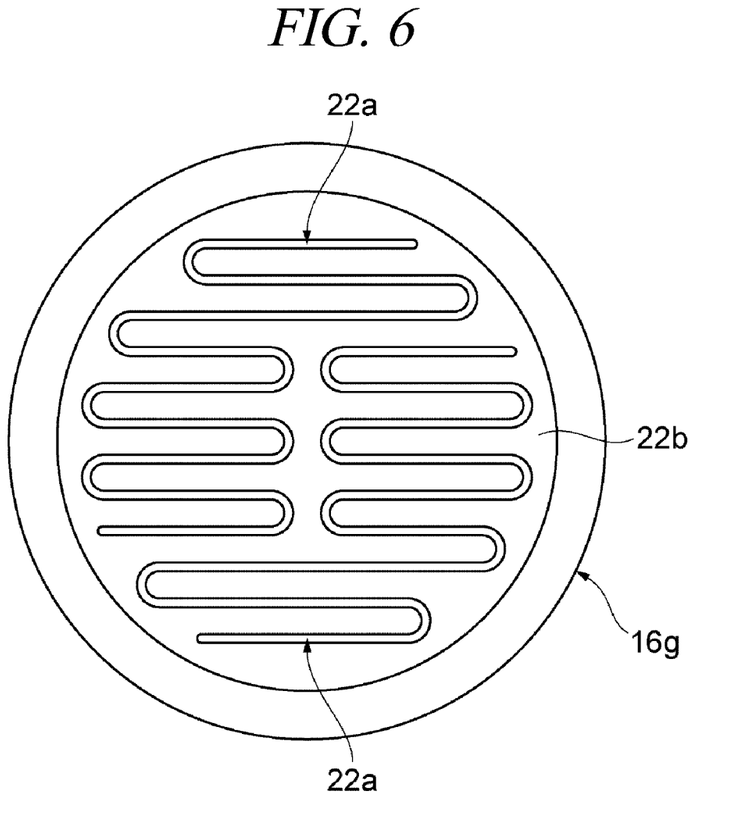
FIG. 6 is a plane view illustrating an injector in accordance with still another illustrative embodiment.

FIG. 6 is a plane view illustrating an injector in accordance with still another illustrative embodiment. Each of the through holes 22a shown in FIG. 4 has a slit shape elongated in one direction. However, in accordance with present illustrative embodiment, a slit-shaped through hole 22a may be formed in a zigzag shape along a surface parallel to a direction in which the through hole 22a is formed (i.e., in a direction of the axis line X), as shown in FIG. 6. In accordance with the present illustrative embodiment depicted in FIG. 6, a through hole having a narrow width can be also formed, and plasma generation within the through hole 22a can be also suppressed.

While various aspects and embodiments have been described herein, other aspects and embodiments will be apparent to those skilled in the art. The various aspects and embodiments disclosed herein are not intended to be limiting and various modifications may be made without departing from the scope of the disclosure. By way of example, although the above-described plasma processing apparatus 10 is configured as a plasma processing apparatus of a type using microwave supplied from a radial line lot antenna as a plasma source, the embodiments may also be applicable to another type of plasma processing apparatus. For example, the above-described injector and electric field shield may be used in a dielectric window of a SWP (Surface Wave Plasma) type plasma processing apparatus. Further, the above-described injector and electric field shield may also be used in a dielectric window of an ECR (Electron Cyclotron Resonance) type plasma processing apparatus. Such an ECR plasma processing apparatus may employ a basic configuration of an ECR plasma processing apparatus disclosed in, e.g., International Patent Publication No. 99/49705.

What is claimed is:

1. A plasma processing apparatus comprising: a processing chamber having a processing space therein; a stage provided within the processing chamber; a dielectric member, having a through hole, provided to face the stage;
a microwave introduction device comprising a coaxial waveguide and configured to introduce microwave into the processing space via the dielectric member;
an injector, having at least one through hole, made of a dielectric material and provided within the dielectric member; and
an electric field shield within the dielectric member and enclosing the injector,
wherein the coaxial waveguide, the injector and the through hole of the dielectric member form a path for supplying a processing gas into the processing space, and
the electric field shield is extended downwardly from an upper surface of the injector to a position that is within the dielectric member and closer to the processing space than a bottom surface of the injector.

2. The plasma processing apparatus of claim 1, wherein the injector is made of a bulk dielectric material.

3. The plasma processing apparatus of claim 1, wherein the injector is in contact with the dielectric member.

4. The plasma processing apparatus of claim 1, wherein the injector is formed as one single body with the dielectric member.

5. The plasma processing apparatus of claim 1, wherein the injector has a first surface and a second surface opposite to the first surface, the second surface facing the processing space,
the at least one through hole of the injector is extended between the first surface and the second surface, and
the electric field shield is extended to a position closer to the processing space than the second surface in a direction from the first surface toward the second surface.

6. The plasma processing apparatus of claim 1, wherein the microwave introduction device comprises:
a coaxial waveguide; and
a slot plate, made of a metal, serving as an antenna coupled to the coaxial waveguide and having a multiple number of slots in a radial direction and in a circumferential direction thereof, and
the processing gas is supplied into the injector from a pipe disposed in a hole inside an inner conductor of the coaxial waveguide.

7. The plasma processing apparatus of claim 6, wherein the electric field shield is integrated as one single body with the pipe.

8. The plasma processing apparatus of claim 1, wherein the injector is made of quartz.

9. The plasma processing apparatus of claim 1, wherein each of the at least one through hole of the injector has a slit shape.

10. The plasma processing apparatus of claim 9, wherein each of the at least one through hole of the injector is formed such that a width thereof is decreased toward the processing space.

11. The plasma processing apparatus of claim 10, wherein the at least one through hole of the injector is formed by laser machining.

12. The plasma processing apparatus of claim 10, wherein a narrowest portion of the at least one through hole of the injector has a width equal to or smaller than about 0.2 mm.

* * * * *

UNITED STATES PATENT AND TRADEMARK OFFICE
CERTIFICATE OF CORRECTION

PATENT NO.         : 9,111,726 B2
APPLICATION NO.    : 13/454513
DATED              : August 18, 2015
INVENTOR(S)        : Kazuki Moyama et al.

Page 1 of 1

It is certified that error appears in the above-identified patent and that said Letters Patent is hereby corrected as shown below:

In the specification,

Column 6, line 63, please add -- 22 -- between "injector" and "and the"

Column 7, line 1, please add -- 22 -- between "injector" and "is chemically"

Signed and Sealed this
Seventeenth Day of May, 2016

Michelle K. Lee
*Director of the United States Patent and Trademark Office*